United States Patent
Yuan et al.

(10) Patent No.: US 11,326,907 B2
(45) Date of Patent: May 10, 2022

(54) CIRCUIT AND METHOD FOR CAPACITANCE DETECTION, TOUCH CHIP AND ELECTRONIC DEVICE

(71) Applicant: SHENZHEN GOODIX TECHNOLOGY CO., LTD., Shenzhen (CN)

(72) Inventors: Guangkai Yuan, Shenzhen (CN); Hong Jiang, Shenzhen (CN); Zhi Tang, Shenzhen (CN); Haiming Shen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 137 days.

(21) Appl. No.: 17/009,763

(22) Filed: Sep. 1, 2020

(65) Prior Publication Data
US 2021/0033426 A1   Feb. 4, 2021

Related U.S. Application Data

(63) Continuation of application No. PCT/CN2019/098897, filed on Aug. 1, 2019.

(51) Int. Cl.
*G01D 5/24* (2006.01)
*G01R 27/26* (2006.01)
(Continued)

(52) U.S. Cl.
CPC .............. *G01D 5/24* (2013.01); *G06F 3/044* (2013.01); *H03K 17/962* (2013.01)

(58) Field of Classification Search
CPC ......... H03K 17/962; G06F 3/044; G01D 5/24
See application file for complete search history.

(56) References Cited

U.S. PATENT DOCUMENTS

2010/0307840 A1   12/2010 Kobayashi et al.
2013/0307811 A1*  11/2013 Hanssen .............. H03K 17/962
                                                            345/174
(Continued)

FOREIGN PATENT DOCUMENTS

CN         104049822 A    9/2014
CN         107980115 A    5/2018
(Continued)

*Primary Examiner* — Alesa Allgood
(74) *Attorney, Agent, or Firm* — Emerson, Thomson & Bennett, LLC; Roger D. Emerson; Warren A. Rosborough

(57) ABSTRACT

A circuit and method for capacitance detection, a touch chip, and an electronic device are provided. The circuit includes a control module, a driving module, an offsetting module, and a charge transfer module, the driving module being configured to positively charge a capacitor to be detected through a first charging branch circuit, or negatively charge the capacitor to be detected through a second charging branch circuit under the control of the control module; the offsetting module being configured to offset base capacitance of the capacitor to be detected through a first offsetting branch circuit under the control of the control module, or offset the base capacitance of the capacitor to be detected through a second offsetting branch circuit under the control of the control module; the charge transfer module being configured to transfer a charge on the capacitor to be detected to generate an output voltage.

20 Claims, 7 Drawing Sheets

(51) Int. Cl.
   *G06F 3/044* (2006.01)
   *H03K 17/96* (2006.01)

(56) References Cited

U.S. PATENT DOCUMENTS

| | | |
|---|---|---|
| 2015/0145534 A1 | 5/2015 | Huang |
| 2019/0171312 A1* | 6/2019 | Chen ..................... G06F 3/044 |
| 2019/0302928 A1 | 10/2019 | Yuan et al. |

FOREIGN PATENT DOCUMENTS

| | | |
|---|---|---|
| CN | 108124464 | 6/2018 |
| CN | 108475155 A | 8/2018 |
| EP | 3640780 | 4/2020 |
| WO | 2017043821 | 3/2017 |

* cited by examiner

CIRCUIT AND METHOD FOR CAPACITANCE DETECTION, TOUCH CHIP AND ELECTRONIC DEVICE

CROSS-REFERENCE TO RELATED APPLICATION

This application is a continuation of International Application No. PCT/CN2019/098897, filed on Aug. 1, 2019, the application of which is hereby incorporated by reference in its entirety.

TECHNICAL FIELD

Embodiments of the present disclosure relate to the field of capacitance detection technologies, and in particular to, a circuit, touch chip, and electronic device for capacitance detection.

BACKGROUND

The principle of self-capacitance detection is that a capacitor will be formed between a detection electrode and system ground, which is known as the self-capacitance detection. The capacitor formed between the detection electrode and the system ground has base capacitance or initial capacitance. When a finger approaches or touches the detection electrode, capacitance between the detection electrode and the system ground will be enhanced, and a user-related touch control operation may be determined by detecting a variation of the capacitance.

In the field of capacitive touch control, a flexible screen is an important development direction. When implementing capacitive touch control detection using the above self-capacitance principle, the flexible screen tends to be thinner than a conventional capacitive touch screen, such that the detection electrode is closer to the system ground. Thus, base capacitance of the capacitor is obviously higher than base capacitance of the capacitor of the conventional capacitive touch screen. In addition, since a metal-mesh is used as the detection electrode, the sensing area is relatively small, such that when the finger touches the capacitor, the capacitance variation is small. A small capacitance variation means to require a high circuit gain, such that the detection circuit can detect an electrical signal generated by the capacitance variation during touching, but since the base capacitance is much higher than the capacitance variation, a high circuit gain, if employed, further tends to cause detection circuit saturation.

Further, the electrical signal caused by the small capacitance variation is also very small, and is easily submerged in circuit noise, thus failing to be detected. Thus it can be seen that, the prior art has the defect of low self-capacitance detection sensitivity, finally resulting in low accuracy of the self-capacitance detection.

SUMMARY

In view of this, one of the technical problems solved by embodiments of the present disclosure is to provide a circuit, touch chip, and electronic device for capacitance detection, to overcome the above defect in the prior art.

An embodiment of the present disclosure provides a circuit for capacitance detection, including: a control module, a driving module, an offsetting module, and a charge transfer module, the driving module being configured to positively charge a capacitor to be detected through a first charging branch circuit, or negatively charge the capacitor to be detected through a second charging branch circuit under the control of the control module; the offsetting module being configured to offset base capacitance of the capacitor to be detected through a first offsetting branch circuit under the control of the control module, or offset the base capacitance of the capacitor to be detected through a second offsetting branch circuit under the control of the control module; the charge transfer module being configured to transfer a charge on the capacitor to be detected to generate an output voltage.

Alternatively, in the circuit for capacitance detection according to any embodiment of the present disclosure, the driving module includes at least two switch units, and the at least two switch units switch switching states under the control of the control module to form the first charging branch circuit or the second charging branch circuit.

Alternatively, in the circuit for capacitance detection according to any embodiment of the present disclosure, the switch units are single-pole single-throw switch units, and the control module is further configured to control one of the single-pole single-throw switch units to be closed, to form the first charging branch circuit, or control the other of the single-pole single-throw switch units to be closed, to form the second charging branch circuit.

Alternatively, in the circuit for capacitance detection according to any embodiment of the present disclosure, the switch units are single-pole double-throw switch units, and the control module is further configured to control the single-pole double-throw switch units to switch between different contacts to form the first charging branch circuit or the second charging branch circuit.

Alternatively, in the circuit for capacitance detection according to any embodiment of the present disclosure, the capacitor to be detected is connected to a positive voltage source through the first charging branch circuit, such that the first charging branch circuit positively charges the capacitor to be detected; and the capacitor to be detected is electrically connected to a negative voltage source through the second charging branch circuit, such that the second charging branch circuit negatively charges the capacitor to be detected.

Alternatively, in the circuit for capacitance detection according to any embodiment of the present disclosure, the offsetting module includes at least two switch units, and the at least two switch units switch switching states under the control of the control module to form the first offsetting branch circuit or the second offsetting branch circuit.

Alternatively, in the circuit for capacitance detection according to any embodiment of the present disclosure, the switch units are single-pole single-throw switch units, and the control module is further configured to control one of the single-pole single-throw switch units to be closed, to form the first offsetting branch circuit, or control the other of the single-pole single-throw switch units to be closed, to form the second offsetting branch circuit.

Alternatively, in the circuit for capacitance detection according to any embodiment of the present disclosure, the switch units are single-pole double-throw switch units, and the control module is further configured to control the single-pole double-throw switch units to switch between different contacts to form the first offsetting branch circuit or the second offsetting branch circuit.

Alternatively, in the circuit for capacitance detection according to any embodiment of the present disclosure, the offsetting module is connected to a negative voltage source through one terminal of the first offsetting branch circuit, such that the base capacitance of the capacitor to be detected is offset through the first offsetting branch circuit; and the offsetting module is connected to a positive voltage source through one terminal of the second offsetting branch circuit, such that the base capacitance of the capacitor to be detected is offset through the second offsetting branch circuit.

Alternatively, in the circuit for capacitance detection according to any embodiment of the present disclosure, the offsetting module includes a first offset resistor and a second offset resistor, the capacitor to be detected being in a first discharging state through the first offset resistor when the offsetting module offsets the base capacitance of the capacitor to be detected through the first offsetting branch circuit; and the capacitor to be detected being in a second discharging state through the second offset resistor when the offsetting module offsets the base capacitance of the capacitor to be detected through the second offsetting branch circuit.

Alternatively, in the circuit for capacitance detection according to any embodiment of the present disclosure, a resistance of the first offset resistor is unequal to a resistance of the second offset resistor.

Alternatively, in the circuit for capacitance detection according to any embodiment of the present disclosure, the base capacitance of the capacitor to be detected is offset through the first offsetting branch circuit, after the capacitor to be detected is positively charged through the first charging branch circuit; or the base capacitance of the capacitor to be detected is offset through the second offsetting branch circuit, after the capacitor to be detected is negatively charged through the second charging branch circuit.

Alternatively, in the circuit for capacitance detection according to any embodiment of the present disclosure, the charge transfer module includes a differential amplifying circuit, an inverting terminal of the differential amplifying circuit is electrically connected to a common mode voltage, and a non-inverting terminal of the differential amplifying circuit is electrically connected to the capacitor to be detected, to transfer the charge on the capacitor to be detected; or the non-inverting terminal of the differential amplifying circuit is electrically disconnected from the capacitor to be detected, to charge or offset the capacitor to be detected.

Alternatively, in the circuit for capacitance detection according to any embodiment of the present disclosure, when there are a plurality of the capacitor to be detected, each of the capacitor to be detected is equipped with the driving module, the offsetting module, and the charge transfer module.

An embodiment of the present disclosure provides a method for capacitance detection, including:

positively charging, by a driving module, a capacitor to be detected through a first charging branch circuit under the control of a control module, or negatively charging, by the driving module, the capacitor to be detected through a second charging branch circuit under the control of a control module;

offsetting, by an offsetting module, base capacitance of the capacitor to be detected through a first offsetting branch circuit under the control of the control module, or offsetting, by the offsetting module, the base capacitance of the capacitor to be detected through a second offsetting branch circuit under the control of the control module; and transferring, by a charge transfer module, a charge on the capacitor to be detected to generate an output voltage.

Alternatively, in the method for capacitance detection according to any embodiment of the present disclosure, the driving module includes at least two switch units, and the method further includes: the at least two switch units switch switching states under the control of the control module to form the first charging branch circuit or the second charging branch circuit.

Alternatively, in the method for capacitance detection according to any embodiment of the present disclosure, the switch units are single-pole single-throw switch units, and the controlling, by the control module, the at least two switch units to switch switching states to form the first charging branch circuit or the second charging branch circuit includes: controlling, by the control module, one of the single-pole single-throw switch units to be closed, to form the first charging branch circuit, or controlling, by the control module, the other of the single-pole single-throw switch units to be closed, to form the second charging branch circuit.

Alternatively, in the method for capacitance detection according to any embodiment of the present disclosure, the switch units are single-pole double-throw switch units, and the method further includes: controlling, by the control module, the single-pole double-throw switch units to switch between different contacts to form the first charging branch circuit or the second charging branch circuit.

Alternatively, in the method for capacitance detection according to any embodiment of the present disclosure, when the first charging branch circuit positively charges the capacitor to be detected, the capacitor to be detected is connected to a positive voltage source through the first charging branch circuit; or when the second charging branch circuit negatively charges the capacitor to be detected, the capacitor to be detected is electrically connected to a negative voltage source through the second charging branch circuit.

Alternatively, in the method for capacitance detection according to any embodiment of the present disclosure, the driving module includes at least two switch units, and the method further includes: the at least two switch units switch switching states under the control of the control module to form the first offsetting branch circuit or the second offsetting branch circuit.

Alternatively, in the method for capacitance detection according to any embodiment of the present disclosure, the switch units are single-pole single-throw switch units, and the controlling, by the control module, the at least two switch units to switch switching states to form the first offsetting branch circuit or the second offsetting branch circuit includes: controlling, by the control module, one of the single-pole single-throw switch units to be closed, to form the first offsetting branch circuit, or controlling, by the control module, the other of the single-pole single-throw switch units to be closed, to form the second offsetting branch circuit.

Alternatively, in the method for capacitance detection according to any embodiment of the present disclosure, the switch units are single-pole double-throw switch units, and the method further includes: controlling, by the control module, the single-pole double-throw switch units to switch between different contacts to form the first offsetting branch circuit or the second offsetting branch circuit.

Alternatively, in the method for capacitance detection according to any embodiment of the present disclosure, the offsetting module is connected to a negative voltage source through one terminal of the first offsetting branch circuit, when the base capacitance of the capacitor to be detected is offset through the first offsetting branch circuit; and the offsetting module is connected to a positive voltage source through one terminal of the second offsetting branch circuit, when the base capacitance of the capacitor to be detected is offset through the second offsetting branch circuit.

Alternatively, in the method for capacitance detection according to any embodiment of the present disclosure, the offsetting module includes a first offset resistor and a second offset resistor, the capacitor to be detected being in a first discharging state through the first offset resistor when the offsetting module offsets the base capacitance of the capacitor to be detected through the first offsetting branch circuit; and the capacitor to be detected being in a second discharging state through the second offset resistor when the offsetting module offsets the base capacitance of the capacitor to be detected through the second offsetting branch circuit.

Alternatively, in the method for capacitance detection according to any embodiment of the present disclosure, the base capacitance of the capacitor to be detected is offset through the first offsetting branch circuit, after the capacitor to be detected is positively charged through the first charging branch circuit; or the base capacitance of the capacitor to be detected is offset through the second offsetting branch circuit, after the capacitor to be detected is negatively charged through the second charging branch circuit.

Alternatively, in the method for capacitance detection according to any embodiment of the present disclosure, a resistance of the first offset resistor is unequal to a resistance of the second offset resistor.

Alternatively, in the method for capacitance detection according to any embodiment of the present disclosure, the charge transfer module includes a differential amplifying circuit, an inverting terminal of the differential amplifying circuit is electrically connected to a common mode voltage, a non-inverting terminal of the differential amplifying circuit is electrically connected to the capacitor to be detected when the charge on the capacitor to be detected is transferred, and the non-inverting terminal of the differential amplifying circuit is electrically disconnected from the capacitor to be detected when the capacitor to be detected is charged or offset.

Alternatively, in the method for capacitance detection according to any embodiment of the present disclosure, when there are a plurality of the capacitor to be detected, each of the capacitor to be detected is equipped with the driving module, the offsetting module, and the charge transfer module.

An embodiment of the present disclosure provides a touch chip, including: the circuit for capacitance detection in any embodiment of the present disclosure.

An embodiment of the present disclosure provides an electronic device, including the touch chip according to any embodiment of the present disclosure.

In the technical solutions provided by embodiments of the present disclosure, the circuit for capacitance detection includes: a control module, a driving module, an offsetting module, and a charge transfer module, the driving module being configured to positively charge a capacitor to be detected through a first charging branch circuit, or negatively charge the capacitor to be detected through a second charging branch circuit under the control of the control module; the offsetting module being configured to offset base capacitance of the capacitor to be detected through a first offsetting branch circuit under the control of the control module, or offset the base capacitance of the capacitor to be detected through a second offsetting branch circuit under the control of the control module; the charge transfer module being configured to transfer a charge on the capacitor to be detected to generate an output voltage; the output voltage being used for determining a capacitance variation of the capacitor to be detected before and after the capacitor to be detected is affected by an external electric field. Therefore, when the circuit for capacitance detection is applied to self-capacitance detection, the influence of detected base capacitance of the capacitor to be detected may be eliminated or reduced through charge offsetting, thereby improving the capacitance variation rate and enhancing the sensitivity of the self-capacitance detection in the case where the capacitance variation remains unchanged, and finally improving the accuracy of the self-capacitance detection.

BRIEF DESCRIPTION OF THE DRAWINGS

Some specific embodiments of embodiments of the present disclosure will be described in detail below with reference to the accompanying drawings by way of an example, instead of in a limited manner. Identical reference numerals in the accompanying drawings represent identical or similar components or parts. As will be appreciated by those skilled in the art, these accompanying drawings may not be drawn to scale. In the drawings.

DETAILED DESCRIPTION

Figure 1A:
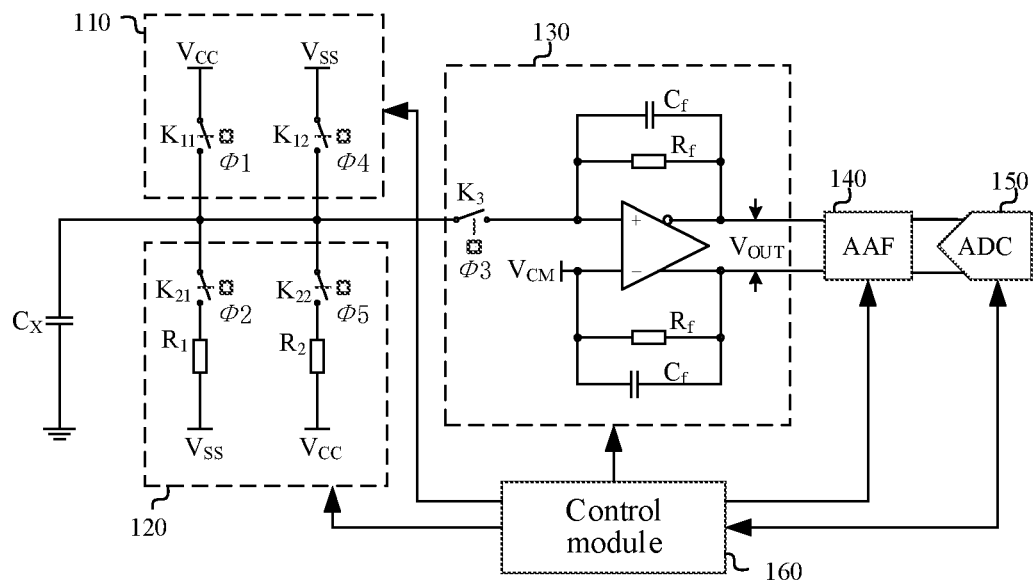
FIG. 1A is a schematic structural diagram of a circuit for capacitance detection in embodiment I of the present disclosure.

Any technical solution of embodiments of the present disclosure may not necessarily be implemented to achieve all of the above advantages.

In the following technical solutions provided by the embodiments of the present disclosure, a circuit for capacitance detection includes: a control module, a driving module, an offsetting module, and a charge transfer module, the driving module being configured to positively charge a capacitor to be detected through a first charging branch circuit, or negatively charge the capacitor to be detected through a second charging branch circuit under the control of the control module; the offsetting module being configured to offset base capacitance of the capacitor to be detected through a first offsetting branch circuit under the control of the control module, or offset the base capacitance of the capacitor to be detected through a second offsetting branch circuit under the control of the control module; the charge transfer module being configured to transfer a charge on the capacitor to be detected to generate an output voltage; the output voltage being used for determining a capacitance variation of the capacitor to be detected before and after the capacitor to be detected is affected by an external electric field. Therefore, when the circuit for capacitance detection is applied to self-capacitance detection, detected base capacitance of the capacitor to be detected may be eliminated or reduced through charge offsetting, thereby improving the capacitance variation rate and enhancing the sensitivity of the self-capacitance detection in the case where the capacitance variation remains unchanged, and finally improving the accuracy of the self-capacitance detection.

Specific implementations of the embodiments of the present disclosure will be further illustrated below in conjunction with the accompanying drawings of the embodiments of the present disclosure.

In the following embodiments I and II, the description is provided by taking implementation of self-capacitance detection of a capacitor to be detected as an example. Therefore, in the following embodiments, either of the number of driving modules and the number of offsetting modules is one. In practice, similarly, from the perspective of technical concepts, if there is a plurality of capacitor to be detected, then a plurality of driving modules and offsetting modules may be provided accordingly, or one driving module and one offsetting module may be provided for one capacitor to be detected.

Alternatively, during implementation, the driving module may include at least one switch and a voltage source configured correspondingly to form the first charging branch circuit and the second charging branch circuit, and the offsetting module may include at least one switch and a voltage source configured correspondingly to form the first offsetting branch circuit and the second offsetting branch circuit. However, it should be noted that the implementation of the driving module and the offsetting module by providing the switch and the voltage source is merely an example, and those of ordinary skills in the art may also use any other driving module that can form the first charging branch circuit and the second charging branch circuit, and any other offsetting module that can form the first offsetting branch circuit and the second offsetting branch circuit.

Alternatively, during implementation, the driving module may include at least two switch units, and the at least two switch units switch switching states under the control of the control module to form the first charging branch circuit or the second charging branch circuit, thereby eliminating the low frequency noise in the circuit, and improving the signal to noise ratio. In the following embodiment, the description is provided by taking the driving module that includes two switch units as an example.

Alternatively, during implementation, the switch units are specifically single-pole single-throw switch units, and the control module is further configured to control one of the single-pole single-throw switch units to be closed, to form the first charging branch circuit, or control the other of the single-pole single-throw switch units to be closed, to form the second charging branch circuit.

Alternatively, during implementation, when the first charging branch circuit positively charges the capacitor to be detected, the capacitor to be detected is connected to a positive voltage source through the first charging branch circuit; or when the second charging branch circuit negatively charges the capacitor to be detected, the capacitor to be detected is electrically connected to a negative voltage source through the second charging branch circuit.

Alternatively, during implementation, the offsetting module may include at least two switch units, and the at least two switch units switch switching states under the control of the control module to form the first offsetting branch circuit or the second offsetting branch circuit. In the following embodiment, the description is provided by taking the driving module that includes two switch units as an example.

Alternatively, during implementation, the switch units are single-pole single-throw switch units, and the control module is further configured to control one of the single-pole single-throw switch units to be closed, to form the first offsetting branch circuit, or control the other of the single-pole single-throw switch units to be closed, to form the second offsetting branch circuit.

Alternatively, during implementation, the offsetting module is connected to a negative voltage source through one terminal of the first offsetting branch circuit, when the base capacitance of the capacitor to be detected is offset through the first offsetting branch circuit; and the offsetting module is connected to a positive voltage source through one terminal of the second offsetting branch circuit, when the base capacitance of the capacitor to be detected is offset through the second offsetting branch circuit.

Alternatively, during implementation, the offsetting module includes a first offset resistor and a second offset resistor, the capacitor to be detected being in a first discharging state through the first offset resistor when the offsetting module offsets the base capacitance of the capacitor to be detected through the first offsetting branch circuit; and the capacitor to be detected being in a second discharging state through the second offset resistor when the offsetting module offsets the base capacitance of the capacitor to be detected through the second offsetting branch circuit.

Alternatively, a resistance of the first offset resistor is unequal to a resistance of the second offset resistor.

Alternatively, during implementation, the base capacitance of the capacitor to be detected is offset through the first offsetting branch circuit, after the capacitor to be detected is positively charged through the first charging branch circuit; or the base capacitance of the capacitor to be detected is offset through the second offsetting branch circuit, after the capacitor to be detected is negatively charged through the second charging branch circuit.

Alternatively, during implementation, the charge transfer module includes a differential amplifying circuit, an inverting terminal of the differential amplifying circuit is electrically connected to a common mode voltage, a non-inverting terminal of the differential amplifying circuit is electrically connected to the capacitor to be detected when the charge on the capacitor to be detected is transferred, and the non-inverting terminal of the differential amplifying circuit is electrically disconnected from the capacitor to be detected when the capacitor to be detected is charged or offset.

Specifically to the following embodiment I and embodiment II, two switch units specifically included in a driving module 110 are denoted as $K_{11}$ and $K_{12}$ respectively, the positive voltage source is denoted as Vcc, the negative voltage source is denoted as Vss, and both the switch unit $K_{11}$ and the switch unit $K_{12}$ are single-pole single-throw switch units. Two switch units specifically included in an offsetting module 120 are denoted as $K_{21}$ and $K_{22}$ respectively, the positive voltage source is denoted as Vcc, and the negative voltage source is denoted as Vss. The offsetting module 120 further includes two offset resistors, denoted as $R_1$ and $R_2$ respectively. In addition, a transfer module is denoted as 130, which includes a differential amplifier, a feedback resistor Rf, and a feedback capacitor Cf, to convert the charge on the capacitor to be detected into a voltage signal. An output voltage of the transfer module 130 is filtered through an anti-alias filter (AAF for short) 140, and then sent into an analog-digital converter (ADC for short) 150 for sampling, followed by quadrature (IQ) demodulation by a digital signal processor (DSP for short). Raw data thus obtained is sent to a CPU for coordinate computation, to obtain a touch position. In addition, the control module is denoted as 160, and control signals controlling the switch unit $K_{11}$, the switch unit $K_{12}$, the switch unit $K_{21}$, the switch unit $K_{22}$, and a switch unit $K_3$ are denoted as $\Phi 1$, $\Phi 4$, $\Phi 2$, $\Phi 5$, and $\Phi 3$ respectively.

Figure 1B:
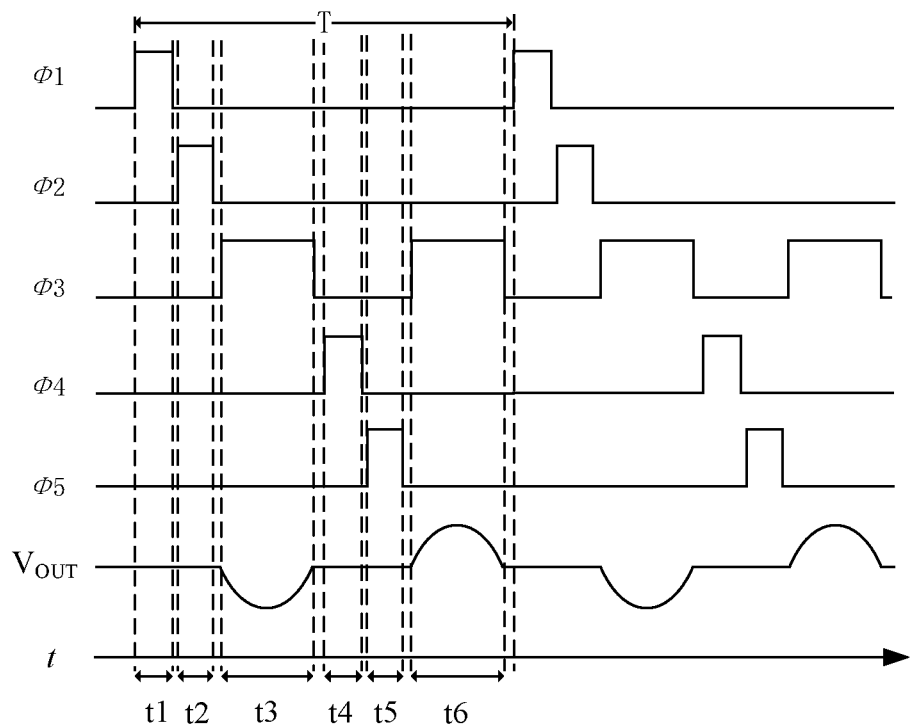
FIG. 1B is a schematic diagram of a working sequence of the circuit for capacitance detection in embodiment I of the present disclosure.

FIG. 1A is a schematic structural diagram of a circuit for capacitance detection in embodiment I of the present disclosure; and FIG. 1B is a schematic diagram of a working sequence of the circuit for capacitance detection in embodiment I of the present disclosure. Here, it should be noted that, in FIG. 1B, when capacitance of a capacitor to be detected changes due to an external electric field, whilst perfect offsetting is implemented, an output voltage of a charge transfer module is Vout.

In a period t1: Specifically, in FIG. 1A, when a first charging branch circuit positively charges the capacitor to be detected, the capacitor to be detected is connected to a positive voltage source Vcc through the first charging branch circuit. The first charging branch circuit is specifically: generating a control signal $\Phi 1$ by a control module to control the switch unit $K_{11}$ to be closed, such that a capacitor to be detected Cx is connected to the positive voltage source Vcc, thus forming the first charging branch circuit through which the capacitor to be detected Cx is charged by the positive voltage source Vcc, and its voltage reaches Vcc after charging is completed. In addition, in the period t1, other switch units except for the switch unit $K_{11}$ are disconnected under the control of their respective control signals.

In a period t2: After charging of the capacitor to be detected is completed through the first charging branch circuit, the switch unit $K_{11}$ is disconnected, and the switch unit $K_{21}$ is closed under the control of its control signal $\Phi 2$, to form a first offsetting branch circuit. The capacitor to be detected positively discharges the voltage source Vss (i.e., a first discharging state) through the resistor $R_1$ (i.e., a first offset resistor), to offset base capacitance of the capacitor to be detected. After discharging is completed, a voltage to system ground of the capacitor to be detected is $$u(t_2) = (V_{CC} - V_{SS}) \cdot e^{\frac{-t2}{R_1 C_X}} + V_{SS}.$$

In addition, in the period t2, other switch units except for the switch unit $K_{21}$ are disconnected under the control of their respective control signals.

As can be seen from FIG. 1A, the offsetting module is connected to the negative voltage source Vss through one terminal of the first offsetting branch circuit, when the base capacitance of the capacitor to be detected is offset through the first offsetting branch circuit.

Alternatively, in this embodiment, the capacitor to be detected is in the first discharging state through the first offset resistor when the offsetting module offsets the base capacitance of the capacitor to be detected through the first offsetting branch circuit.

In a period t3: After offsetting of the base capacitance of the capacitor to be detected through the first offsetting branch circuit is completed, the switch unit $K_3$ is closed under the control of its control signal $\Phi 3$. In addition, other switch units are disconnected, and the capacitor to be detected transfers a charge to the charge transfer module, such that the charge transfer module generates the output voltage Vout. The amount of charge transferred from the capacitor to be detected Cx to the charge transfer module is [u(t2)−Vcm]*Cx.

In a period t4: After completing the above charge transferring in the period t3, the switch unit $K_{11}$, the switch unit $K_{21}$, and the switch unit $K_{22}$ are disconnected under the control of their respective control signals, but the switch unit $K_{12}$ is closed under the control of its control signal $\Phi 4$. Since the switch unit $K_{12}$ is closed, a second charging branch circuit is formed to charge the capacitor to be detected, such that the capacitor to be detected is negatively charged to Vss.

In a period t5: After charging of the capacitor to be detected is completed through the second charging branch circuit, the switch unit $K_{11}$, the switch unit $K_{21}$, and the switch unit $K_{12}$ are disconnected under the control of their respective control signals, but the switch unit $K_{22}$ is closed under the control of its control signal $\Phi 5$, to form a second offsetting branch circuit. The capacitor to be detected negatively discharges the voltage source Vcc (i.e., a second discharging state) through the resistor $R_2$ (i.e., a second offset resistor). After discharging is completed, the voltage to system ground of the capacitor to be detected is $$u(t_5) = (V_{SS} - V_{CC}) \cdot e^{\frac{-t5}{R_2 C_X}} + V_{CC}.$$

In a period t6: After offsetting of the base capacitance of the capacitor to be detected through the second offsetting branch circuit is completed, the switch unit $K_3$ is closed under the control of its control signal $\Phi 5$, other switch units are disconnected under the control of their respective control signals, and the capacitor to be detected transfers a charge to the charge transfer module, such that the charge transfer module generates the output voltage Vout. The amount of charge transferred from the capacitor to be detected Cx to the charge transfer module is [u(t5)−Vcm]*Cx.

Alternatively, in this embodiment, a resistance of the first offset resistor is unequal to a resistance of the second offset resistor. Since a charging speed of the circuit is different from a discharging speed of the circuit, by setting a size of the first offset resistor to be unequal to a size of the second offset resistor, the voltage on the capacitor to be detected is exactly Vcm when there is no touch operation, thereby achieving perfect offsetting, to improve the sensitivity of touch control detection.

The above t1 and t4 are charging stages, t2 and t5 are offsetting stages, t3 and t6 are charge transfer stages, and t1 to t6 are a detection period T. t4 to t6 processes are actually inverting processes of t1 to t3, thereby weakening the noise with high correlation in the circuit in the two processes, especially low frequency noise.

In the above embodiments, the charge transfer module includes a differential amplifying circuit (e.g., a double-terminal differential amplifier), an inverting terminal of the differential amplifying circuit is electrically connected to a common mode voltage Vcm, and a non-inverting terminal of the differential amplifying circuit is electrically connected to the capacitor to be detected when the charge on the capacitor to be detected is transferred, to transfer the charge on the capacitor to be detected to the charge transfer module. The non-inverting terminal of the differential amplifying circuit is electrically disconnected from the capacitor to be detected when the capacitor to be detected is charged or offset.

Figure 1C:
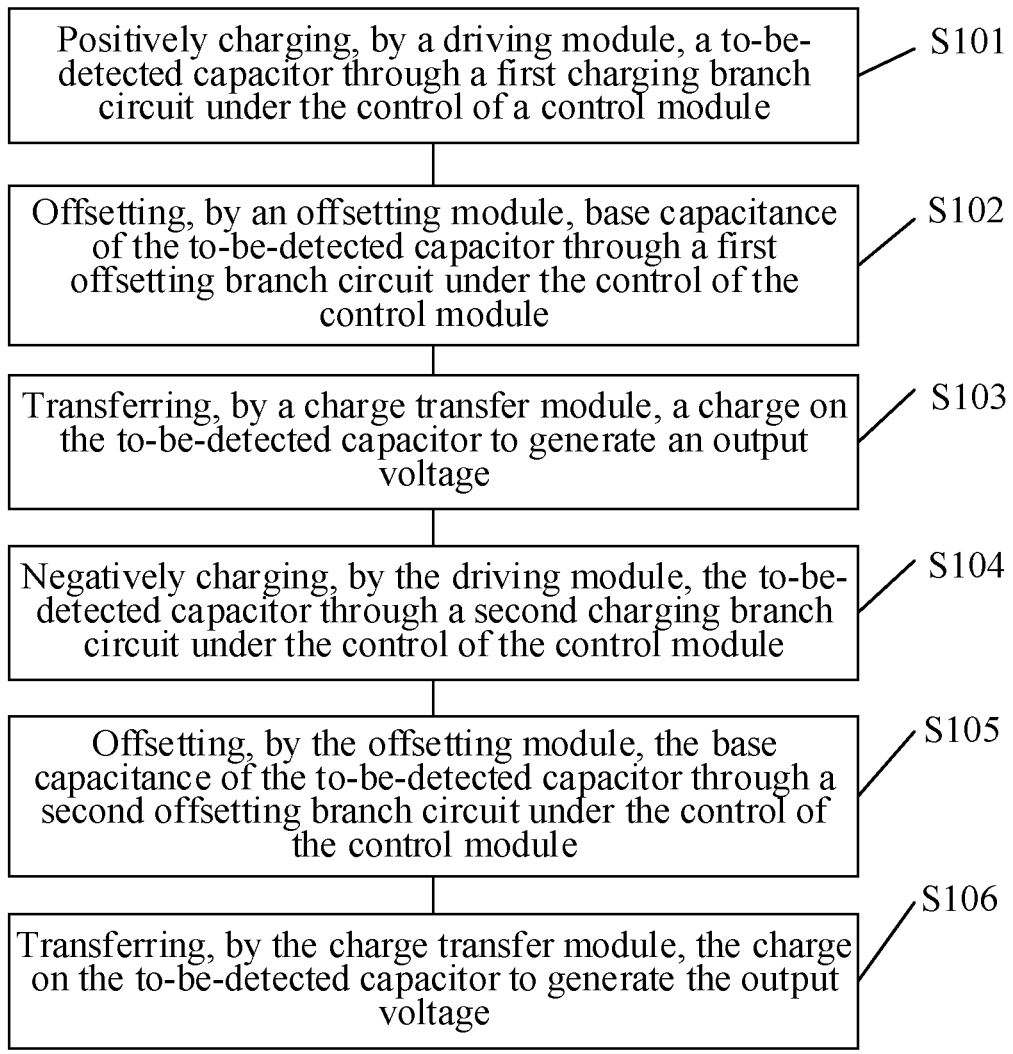
FIG. 1C is a schematic flowchart of a method for capacitance detection in embodiment I of the present disclosure.

FIG. 1C is a schematic flowchart of a method for capacitance detection in embodiment I of the present disclosure. For the circuit for capacitance detection shown in the above FIG. 1A, in a detection period, the corresponding method for capacitance detection includes:

An embodiment of the present disclosure provides a method for capacitance detection, including:

S101: positively charging, by a driving module, a capacitor to be detected through a first charging branch circuit under the control of a control module.

With reference to the above FIG. 1A, the switch unit $K_{11}$ is in a closed state under the control of the control module to form the first charging branch circuit.

In step S101, when the first charging branch circuit positively charges the capacitor to be detected, the capacitor to be detected is connected to the positive voltage source Vcc through the first charging branch circuit.

S102: offsetting, by an offsetting module, base capacitance of the capacitor to be detected through a first offsetting branch circuit under the control of the control module.

In step S102, the offsetting module includes at least two switch units, and one of the switch units $K_{21}$ is controlled by the control module to be closed, to form a first offsetting branch circuit.

In step S102, the offsetting module is connected to the negative voltage source Vss through one terminal of the first offsetting branch circuit, when the base capacitance of the capacitor to be detected is offset through the first offsetting branch circuit.

S103: transferring, by a charge transfer module, a charge on the capacitor to be detected to generate an output voltage.

As shown in FIG. 1A, the switch unit $K_3$ is closed, other switch units are in a disconnected state, and the charge on the capacitor to be detected is transferred to the charge transfer module to generate the output voltage (Vout).

S104: negatively charging, by the driving module, the capacitor to be detected through a second charging branch circuit under the control of the control module.

With reference to the above FIG. 1A, the switch unit $K_{12}$ is in a closed state under the control of the control module to form the second charging branch circuit.

With reference to the above FIG. 1A, when the second charging branch circuit negatively charges the capacitor to be detected, the capacitor to be detected is electrically connected to the negative voltage source Vss through the second charging branch circuit.

S105: offsetting, by the offsetting module, the base capacitance of the capacitor to be detected through a second offsetting branch circuit under the control of the control module.

In this embodiment, in step S105, the offsetting module includes at least two switch units, and one of the switch units $K_{22}$ is controlled by the control module to be closed, to form the second offsetting branch circuit.

In this embodiment, in step S105, the offsetting module is connected to the positive voltage source Vcc through one terminal of the second offsetting branch circuit, when the base capacitance of the capacitor to be detected is offset through the second offsetting branch circuit.

S106: transferring, by the charge transfer module, the charge on the capacitor to be detected to generate the output voltage.

As shown in FIG. 1A, the switch unit $K_3$ is closed, other switch units are in a disconnected state, and the charge on the capacitor to be detected is transferred to the charge transfer module.

To implement effective detection of a capacitance variation of the capacitor to be detected, some detection periods may be set, and the above steps S101-S105 may be executed in each of the detection periods.

A desired situation is that when there is no touch operation, and when t2 and t5 are terminated, the voltage on the capacitor to be detected Cx is exactly Vcm, i.e., when u(t2)=u(t5)=Vcm, the amount of transferred charge is 0, thereby achieving perfect offsetting. Then, when there is no touch, the output voltage of the charge transfer module is 0. When there is a touch operation, the output voltage of the charge transfer module is not 0. In this case, an output voltage of an amplifier is completely generated by a touch, and a larger amplification factor may be used to increase the amplitude of the output voltage to facilitate detection, thereby improving the touch control sensitivity.

In the case of perfect offsetting, the following relational equations are satisfied:

$$(V_{CC} - V_{SS}) \cdot e^{\frac{-t2}{R_1 C_X}} + V_{SS} = V_{CM}$$

$$(V_{SS} - V_{CC}) \cdot e^{\frac{-t5}{R_2 C_X}} + V_{CC} = V_{CM}$$

$$t2 = -R_1 C_X \ln \frac{V_{CM} - V_{SS}}{V_{CC} - V_{SS}} \text{ and } t5 = -R_2 C_X \ln \frac{V_{CC} - V_{CM}}{V_{CC} - V_{SS}}$$

may be obtained.

Alternatively, in this embodiment, a size of the R1 is set to be unequal to a size of the R2. Since a charging speed of the circuit is different from a discharging speed of the circuit, by setting the size of the R1 to be unequal to the size of the R2, the voltage on the capacitor to be detected is exactly Vcm when there is no touch operation, thereby achieving perfect offsetting, to improve the sensitivity of touch control detection.

Considering that t1 to t3 and t4 to t6 are symmetrical processes, t1 will be set to be the same as t4, and t3 will be set to be the same as t6, so it is expected that a value of t2 is also the same as or close to a value of t5. Based on an operating frequency of the circuit, target values of t2 and t5 are first determined, and then computed values of the resistors R1 and R2 are determined based on values of Vcc, Vss, and Vcm and an estimated value of Cx. Due to limited number of resistance value choices of an offset resistor of an actual chip, set values of the R1 and the R2 will deviate from the computed values. The set values of the R1 and the R2 can only approach the computed values as far as possible. Therefore, lengths of time t2 and t5 are finely adjusted after determining the set values of the R1 and the R2, such that an actual value of t2 is equal or as close as possible to an actual value of t5, and such that both the positive and negative processes reach or approximately reach a perfect offsetting state. Then, a gain of the amplifying circuit may be increased to improve the sensitivity of touch control detection.

Figure 2A:
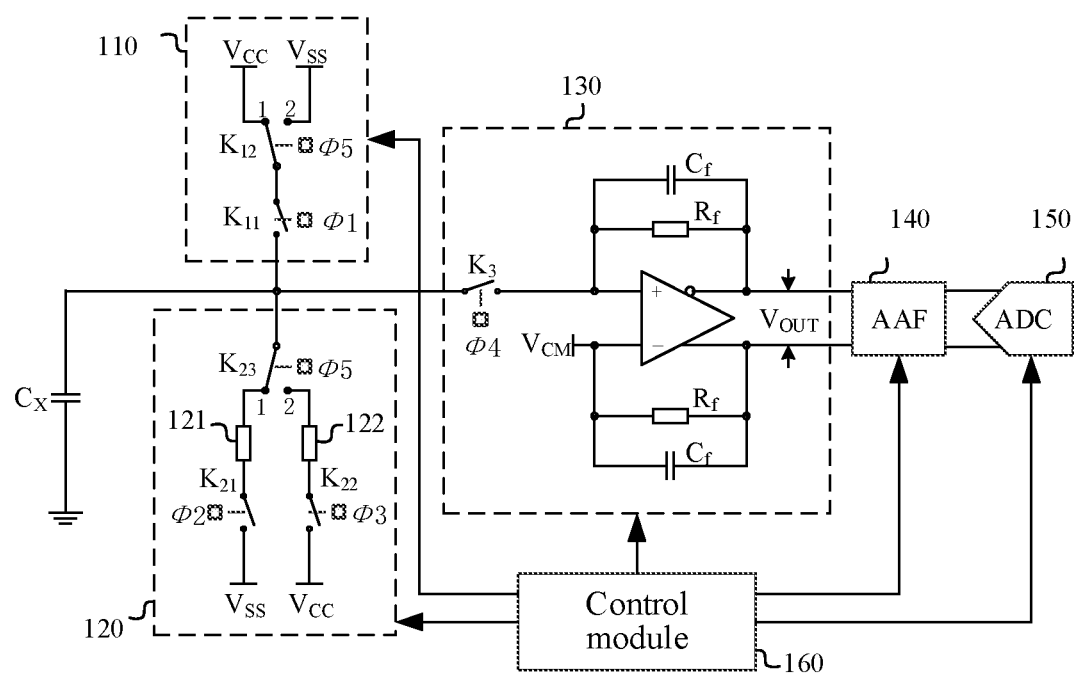
FIG. 2A is a schematic structural diagram of a circuit for capacitance detection in embodiment II of the present disclosure.
Figure 2B:
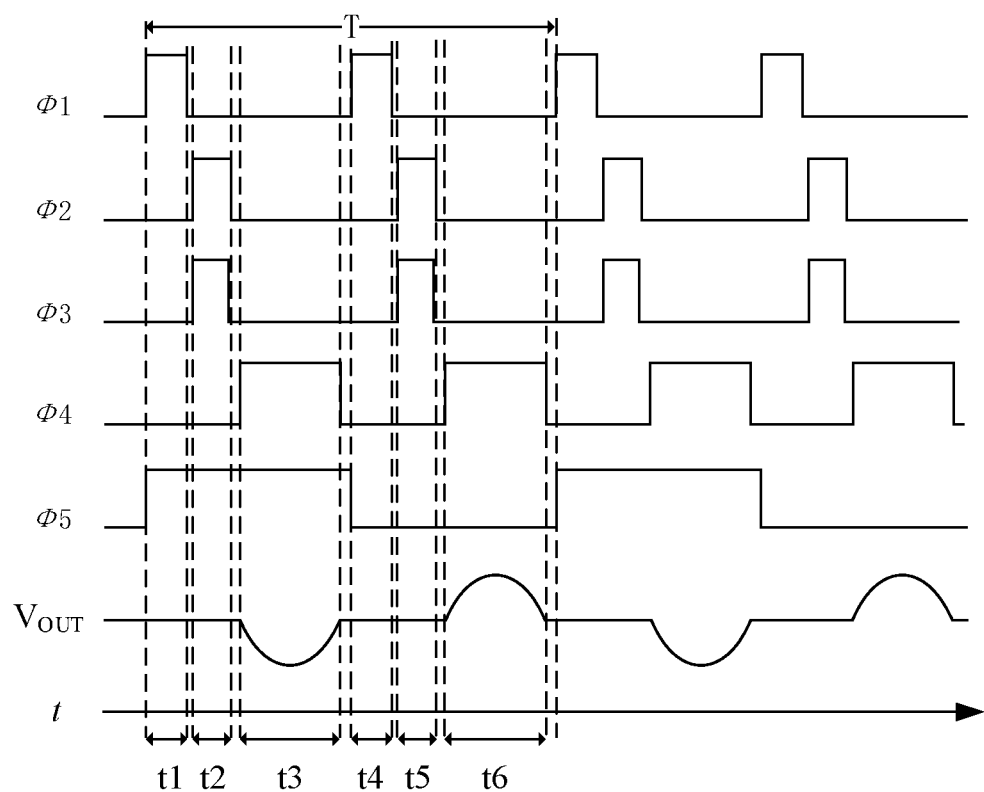
FIG. 2B is a schematic diagram of a working sequence of the circuit for capacitance detection in embodiment II of the present disclosure.

FIG. 2A is a schematic structural diagram of a circuit for capacitance detection in embodiment II of the present disclosure; and FIG. 2B is a schematic diagram of a working sequence of the circuit for capacitance detection in embodiment II of the present disclosure. In terms of a structure of a driving module, similar to the above embodiments, one of the switch units $K_{11}$ is a single-pole double-throw switch unit, and the other of the switch units $K_{12}$ is a single-pole double-throw switch unit, to form a first charging branch circuit or a second charging branch circuit. In addition, in terms of a structure of an offsetting module, a switch unit $K_{23}$ is further provided besides the switch units $K_{21}$ and $K_{22}$. The switch unit $K_{23}$ is a single-pole double-throw switch unit that cooperates with the switch units $K_{21}$ and $K_{22}$ to form a first offsetting branch circuit or a second offsetting branch circuit. In this embodiment, control signals of the switch unit $K_{11}$, the switch unit $K_{12}$, the switch unit $K_{21}$, the switch unit $K_{22}$, the switch unit $K_{23}$, and a switch unit $K_4$ are denoted as control signals Φ1, Φ5, Φ2, Φ3, Φ5, and Φ4 respectively. Here, it should be noted that reference numerals of the control signals are the same as those in embodiment I, which, however, does not mean that they are essentially the same control signals as the control signals in embodiment I.

The differences between the control sequence in this embodiment and that in embodiment I are:

In a stage t1, the switch unit $K_{11}$ is closed under the control of the control signal Φ1, and the switch unit $K_{12}$ is in contact with the contact 1 under the control of the control signal Φ5, to form the first charging branch circuit. The switch unit $K_{23}$ is in contact with the contact 1 under the control signal Φ5, but the offsetting module does not work since the switch unit $K_{21}$ is disconnected under the control of the control signal Φ2.

In a period t2, the switch unit $K_{11}$ is disconnected under the control of the control signal Φ1, the switch unit $K_{21}$ is closed under the control of the control signal Φ2, and the switch unit $K_{22}$ is disconnected under the control of the control signal Φ3, thus forming the first offsetting branch circuit. After the period t2 is terminated, a voltage of the capacitor to be detected is u(t2).

In a period t3, the switch unit $K_3$ is closed under the control of the control signal Φ4, the switch units $K_{11}$, and $K_{21}$ are disconnected under the control of their respective control signals, and a charge on the capacitor to be detected is transferred to a charge transferring module. The amount of transferred charge is [u(t2)−Vcm]*Cx.

In a stage t4, the switch unit $K_{11}$ is closed under the control of the control signal Φ1, and the switch unit $K_{12}$ is in contact with the contact 2 under the control of the control signal Φ5, to form the second charging branch circuit. The switch unit $K_{23}$ is in contact with the contact 2 under the control signal Φ5, but the offsetting module does not work since the switch unit $K_{21}$ is disconnected under the control of the control signal Φ2.

In a period t5, the switch unit $K_{11}$ is disconnected under the control of the control signal Φ1, the switch unit $K_{23}$ is in contact with the contact 2 under the control of the control signal Φ5, the switch unit $K_{22}$ is closed under the control of the control signal Φ3, and the switch unit $K_{21}$ is disconnected under the control of the control signal Φ2, thus forming the second offsetting branch circuit. After the period t5 is terminated, the voltage of the capacitor to be detected is u(t5).

In a period t6, the switch unit $K_3$ is closed under the control of the control signal Φ4, the switch units $K_{11}$, and $K_{21}$ are disconnected under the control of their respective control signals, and a charge on the capacitor to be detected is transferred to a charge transferring module. The amount of transferred charge is [u(t5)−Vcm]*Cx.

Alternatively, in this embodiment, a size of the R1 is set to be unequal to a size of the R2. Since a charging speed of the circuit is different from a discharging speed of the circuit, by setting the size of the R1 to be unequal to the size of the R2, the voltage on the capacitor to be detected is exactly Vcm when there is no touch operation, thereby achieving perfect offsetting, to improve the sensitivity of touch control detection.

As can be seen from the above processes in FIG. 2A, the above t1 and t4 are charging stages, t2 and t5 are offsetting stages, t3 and t6 are charge transfer stages, and t1 to t6 are a detection period T. t4 to t6 processes are actually inverting processes of t1 to t3, thereby weakening the noise with high correlation in the circuit in the two processes, especially low frequency noise. A desired situation is that when there is no touch operation, and when t2 and t5 are terminated, the voltage on the capacitor to be detected Cx is exactly Vcm, i.e., when u(t2)=u(t5)=Vcm, the amount of transferred charge is 0, thereby achieving perfect offsetting. Then, when there is no touch, the output voltage of the charge transfer module is 0. When there is a touch operation, the output voltage of the charge transfer module is not 0. In this case, an output voltage of an amplifier is completely generated by a touch, and a larger amplification factor may be used to increase the amplitude of the output voltage to facilitate detection, thereby improving the touch control sensitivity.

In the case of perfect offsetting, the following relational equations are satisfied:

$$(V_{CC} - V_{SS}) \cdot e^{\frac{-t2}{R_1 C_X}} + V_{SS} = V_{CM}$$

$$(V_{SS} - V_{CC}) \cdot e^{\frac{-t5}{R_2 C_X}} + V_{CC} = V_{CM}$$

$$t2 = -R_1 C_X \ln \frac{V_{CM} - V_{SS}}{V_{CC} - V_{SS}} \text{ and } t5 = -R_2 C_X \ln \frac{V_{CC} - V_{CM}}{V_{CC} - V_{SS}}$$

may be obtained.

Considering that t1 to t3 and t4 to t6 are symmetrical processes, t1 will be set to be the same as t4, and t3 will be set to be the same as t6, so it is expected that a value of t2 is also the same as or close to a value of t5. Based on an operating frequency of the circuit, target values of t2 and t5 are first determined, and then computed values of the resistors R1 and R2 are determined based on values of Vcc, Vss, and Vcm and an estimated value of Cx. However, due to limited available resistance value of an offset resistor of a chip in practice, set values of the R1 and the R2 will deviate from the computed values, and actually can only approach the computed values as far as possible. Lengths of time t2 and t5 are finely adjusted after determining actual values of the R1 and the R2, such that an actual value of t2 is equal or as close as possible to an actual value of t5, and such that both the positive and negative processes reach or approximately reach a perfect offsetting state. Then, a gain of the amplifying circuit may be increased to improve the sensitivity of touch control detection.

The method for capacitance detection implemented by the circuit for capacitance detection shown in FIG. 2A is similar to the embodiment shown in the above FIG. 1A.

Further, the product implementation actually includes some capacitor to be detected, and each of the capacitor to be detected may be equipped with the driving module, the offsetting module, and the charge transfer module. At the same time, when the charge transfer module includes a differential amplifying circuit, similar characteristics between adjacent detection channels when detecting a capacitance variation of the capacitor to be detected can be realized through a differential principle, thereby achieving noise suppression and finally improving the signal to noise ratio. The description is provided below by taking the processing for two capacitor to be detected (denoted as Cx1 and Cx2) as an example.

Figure 3A:
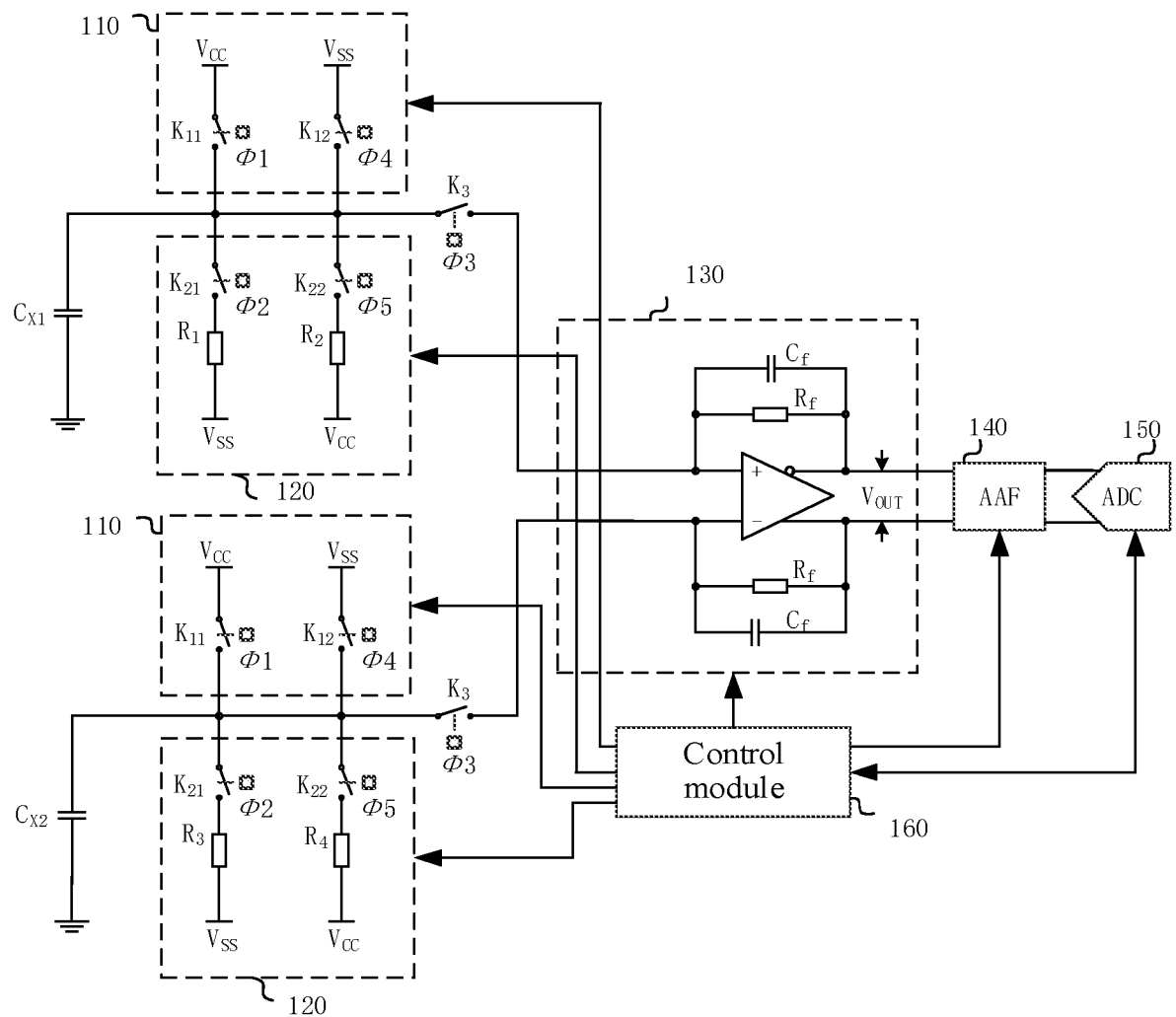
FIG. 3A is a schematic structural diagram of a circuit for capacitance detection in embodiment III of the present disclosure.
Figure 3B:
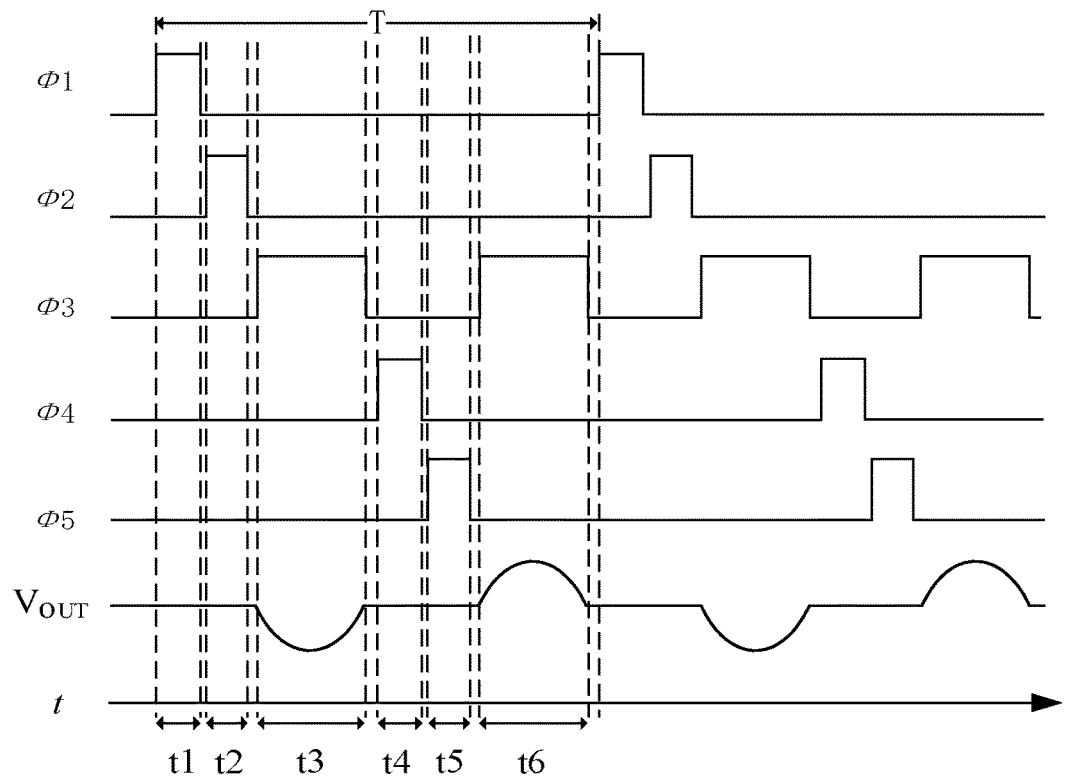
FIG. 3B is a schematic diagram of a working sequence of capacitance detection in embodiment III of the present disclosure.

FIG. 3A is a schematic structural diagram of a circuit for capacitance detection in embodiment III of the present disclosure. FIG. 3B is a schematic sequence diagram of capacitance detection in embodiment III of the present disclosure. As shown in FIG. 3A, a driving module 110 and an offsetting module 120 are provided respectively for the capacitor to be detected Cx1 and Cx2. Different from the above embodiments, in a charge transferring stage, the capacitor to be detected Cx1 and Cx2 are connected to a differential amplifier in the charge transferring module 130 respectively, and actually transfer a charge to the charge transferring module simultaneously. In FIG. 3A, offset resistors in one of the offsetting modules 120 are R1 and R2, and offset resistors in the other of the offsetting modules 120 are R3 and R4.

Therefore, in each period from t1 to t6, switches in the driving module and the offsetting module corresponding to the capacitor to be detected Cx1 and Cx2 are opened or closed simultaneously.

At the end of a moment t2, a voltage to system ground of the capacitor to be detected Cx1 is $$u_1(t_2) = (V_{CC} - V_{SS}) \cdot e^{\frac{-t2}{R_1 C_{X1}}} + V_{SS}.$$

At the end of the moment t2, a voltage to system ground of the capacitor to be detected Cx2 is $$u_2(t_2) = (V_{CC} - V_{SS}) \cdot e^{\frac{-t2}{R_3 C_{X2}}} + V_{SS}.$$

At a moment t3, the amount of charge transferred from the capacitor to be detected Cx1 to the charge transferring module is $\Delta Q_1 = [u_1(t_2) - V_{CM}]C_{X1}$, and the amount of charge transferred from the capacitor to be detected Cx2 to the charge transferring module is $\Delta Q_2 = [u_2(t_2) - V_{CM}]C_{X2}$. Based on sizes of $\Delta Q1$ and $\Delta Q2$, there are the following situations:

if $\Delta Q1 > \Delta Q2$, an output voltage (Vout) of an amplifying circuit is a negative voltage;

if $\Delta Q1 = \Delta Q2$, the output voltage (Vout) of the amplifying circuit is 0; and if $\Delta Q1 < \Delta Q2$, the output voltage (Vout) of the amplifying circuit is a positive voltage.

Similarly, at a moment t5, there will also be the above relationship between the amount of charge transferred from the capacitor to be detected Cx1 to the charge transferring module and the amount of charge transferred from the capacitor to be detected Cx2 to the charge transferring module. In terms of circuit design, from the theoretical perspective, it is necessary to achieve $\Delta Q1 = \Delta Q2$, in order to achieve perfect offsetting.

In this embodiment, charging, offsetting, and charge transferring on two adjacent capacitor to be detected are performed at the same moment, and amplified signals are outputted to a post-stage circuit through the differential amplifier. In a touch control system, adjacent detection channels tend to have similar base capacitance, have similar temperature drifts during temperature change, and have similar noise characteristics. Therefore, this embodiment can suppress noise, can improve the signal to noise ratio, and has the ability to suppress the temperature drift. Further, when an external electric field is caused by a touch, which of the two capacitor to be detected has a larger capacitance variation may also be determined based on a direction of the Vout in the above embodiment III, and then a position of the touch may be further determined based on a relative size relationship of the capacitance.

Figure 4:
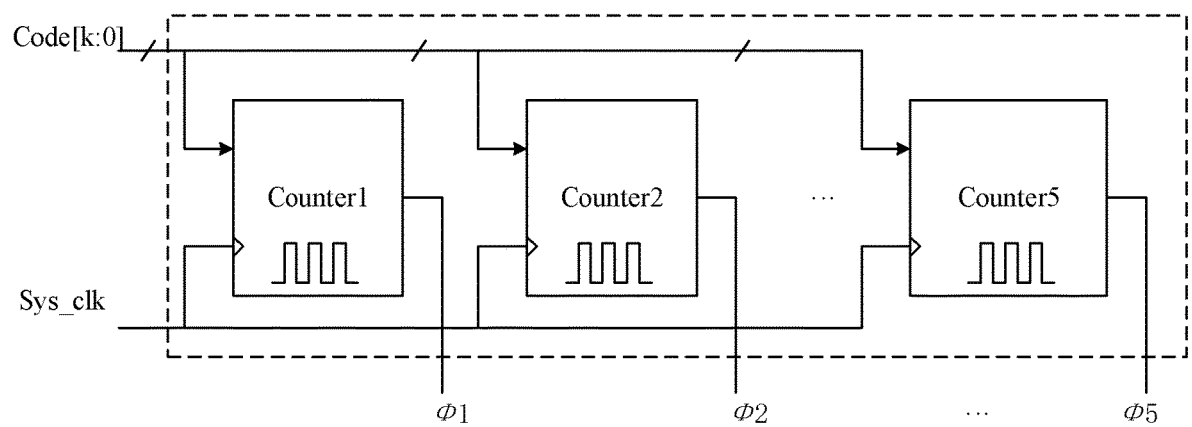
FIG. 4 is an example structural diagram of a control circuit in embodiment IV of the present disclosure.

FIG. 4 is an example structural diagram of a control circuit in embodiment IV of the present disclosure. As shown in FIG. 4, the control circuit includes some counters (e.g., five counters, denoted as counter 1, counter 2, counter 3, counter 4, and counter 5 respectively). An output of each of the counters controls the switch units in the above embodiment I or II, thus forming the above control signals Φ1-Φ5. These counters share a given clock signal (sys-clk) to obtain a given clock precision. The higher the clock frequency is, the higher the time control precision can be obtained. Therefore, a clock signal of a master clock of a touch control detection system is generally used. Its dominant frequency is highest in the entire system. Each counter also has its own data line connected to a corresponding register, and a counting cycle, an action moment, and the like of these counters are modified by modifying a value of the register, thereby achieving the effect of controlling the working sequence of switches.

Figure 5:
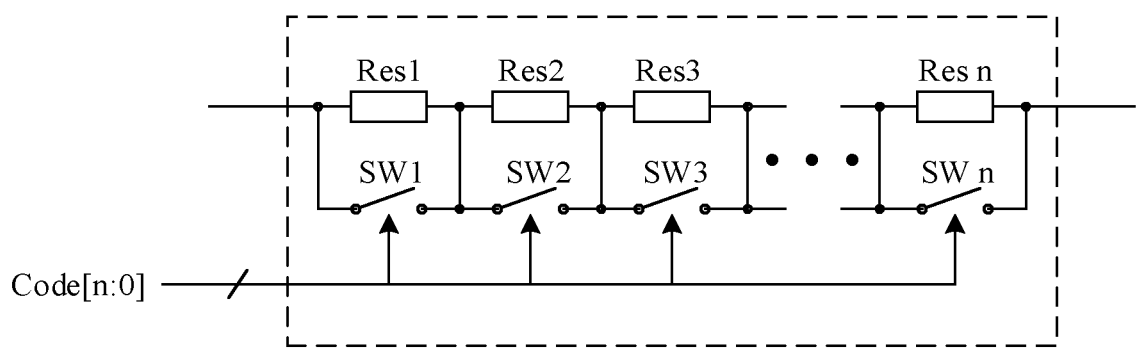
FIG. 5 is an example structural diagram of an offset resistor in embodiment V of the present disclosure.

FIG. 5 is an example structural diagram of an offset resistor in embodiment V of the present disclosure. As shown in FIG. 5, the offset resistor mainly includes a plurality of resistors (Res1 . . . Resn) and a plurality of switches (SW1 . . . SWn). Each resistor is connected in parallel with a switch to form a combination, and some of such combinations are connected in series. Each switch has a control line, and the control lines of all switches are connected to a register together. By modifying a value Code[n:0] of the register, different switches can be opened and closed, thereby controlling a resistance value of the offset resistor.

In the above embodiments, considering that discharging speeds of the two offsetting branch circuits will be different, it is impossible to achieve perfect offsetting (or referred to as complete offsetting as far as possible) of the base capacitance of the capacitor to be detected, and an offset resistor is set separately for each offsetting branch circuit, such that the discharging speeds of the two offsetting branch circuits are as equal as possible by separately designing a size of the offset resistor in each offsetting branch circuit, so as to ensure perfect offsetting. Therefore, in a circuit design of the offsetting module, with reference to FIG. 1, one terminal of the first offset resistor in the first offsetting branch circuit is directly connected to the voltage source Vss, and the other of its terminal is connected to the switch unit $K_{21}$. Similarly, one terminal of the second offset resistor in the second offsetting branch circuit is directly connected to the voltage source Vcc, and the other of its terminal is connected to the switch unit $K_{22}$, such that the two offsetting circuits are independent of each other. In addition, in the circuit design of the offsetting module, the first offset resistor in the first offsetting branch circuit is arranged between the switch units $K_{21}$ and $K_{23}$, the first offset resistor may be connected to the voltage source Vss through the switch unit $K_{21}$; the second offset resistor in the second offsetting branch circuit is arranged between the switch units $K_{22}$ and $K_{23}$, the second offset resistor may be connected to the voltage source Vcc through the switch unit $K_{22}$; and the switch unit $K_{23}$ switches between the contact 1 and the contact 2, thereby forming the first offsetting branch circuit and the second offsetting branch circuit respectively.

In addition, the various voltage sources used in the above embodiments can be generated by a voltage source generating module as required.

An embodiment of the present disclosure further provides an electronic device, including the touch chip according to any embodiment of the present disclosure.

Thus, in a specific application scenario, the larger the base capacitance of the capacitor to be detected is, the smaller the resistance value of the offset capacitor is, and vice versa. In addition, due to the use of a negative voltage source, the detectable output voltage is increased, thereby improving the signal to noise ratio.

It should be noted that, in the above embodiments, the description is provided by taking each switch unit of a single switch as an example, but in practice, the switch unit may also be implemented in a combined circuit structure, where the constituent element may be any electronic component having an on-off function as long as the constituent element can form a charging branch circuit and an offsetting branch circuit, can implement switching from the charging branch circuit to the offsetting branch circuit, and can make the to-be-detected circuit enter a charge transfer state.

In addition, when implementing touch control detection based on mutual capacitance detection, if base capacitance of the mutual capacitance is high enough to affect the variation rate of the mutual capacitance, the following concepts of the embodiment of the present disclosure may also be applied.

The electronic device in the embodiment of the present disclosure exists in various forms, including but not limited to:

(1) a mobile communication device: Such a device is characterized by having mobile communication functions, and is mainly intended to provide voice and data communication. Such a terminal includes: a smart phone (e.g., an iPhone), a multimedia phone, a functional phone, a low-end phone, and the like.

(2) an ultra-mobile personal computer device: Such a device belongs to a category of personal computers, has computing and processing functions, and generally also has the characteristics of mobile Internet access. Such a terminal includes: a device, such as a PDA, a MID, and a UMPC, e.g., an iPad.

(3) a portable entertainment device: Such a device can display and play multimedia contents. Such a device includes: an audio player, a video player (e.g., an iPod), a handheld game player, an e-book, a smart toy, and a portable vehicle navigation device.

(4) a server: a device providing a computing service. The server components include a processor, a hard disk, an internal memory, a system bus, etc. A structure of the server is similar to that of a general computer. But because of the needs of providing a highly reliable service, the requirements in respect of processing capacity, stability, reliability, security, scalability, manageability, etc. are very high.

(5) other electronic apparatuses having data interaction functions.

So far, specific embodiments of the present subject matter have been described. Other embodiments fall within the scope of the appended claims. In some cases, actions disclosed in the appended claims may be performed in different orders and can still achieve the desired results. In addition, the processes depicted in the figures do not necessarily require the shown particular order or sequential order, to achieve desired results. In some embodiments, multitasking and parallel processing may be advantageous.

It should be further noted that the terms such as "comprising", "including" or any other variation thereof are intended to cover non-exclusive inclusions, such that a process, method, article, or device that includes a series of elements not only includes those elements, but also includes other elements that are not explicitly listed, or further includes elements that are inherent to such process, method, article, or device. An element preceded by the wording "comprises a . . . " does not, without more constraints, preclude the existence of additional identical elements in the process, method, article, or deice that includes the element.

Various embodiments in the present specification are described progressively, identical or similar portions of various embodiments may be mutually referred to, and differences of each embodiment from other embodiments are mainly described in the embodiment. In particular, embodiments of the system are substantially similar to embodiments of the method, and therefore, the description is relatively simple. A part of description of the embodiments of the method may be referred to for relevant parts.

The above description merely provides embodiments of the present disclosure, and is not intended to limit the present disclosure. For those skilled in the art, the present disclosure may have various modifications and alterations. Any modification, equivalent replacement, improvement, and the like made within the spirit and principles of the present disclosure should be included within the scope of appended claims of the present disclosure.

What is claimed is:

1. A circuit for capacitance detection, comprising: a control module, a driving module, an offsetting module, and a charge transfer module, the driving module being configured to positively charge a capacitor to be detected through a first charging branch circuit; the offsetting module being configured to offset base capacitance of the capacitor to be detected through a first offsetting branch circuit under the control of the control module; the driving module being configured to negatively charge the capacitor to be detected through a second charging branch circuit under the control of the control module; the offsetting module being configured to offset the base capacitance of the capacitor to be detected through a second offsetting branch circuit under the control of the control module; the charge transfer module being configured to transfer a charge on the capacitor to be detected to generate an output voltage.

2. The circuit according to claim 1, wherein the capacitor to be detected is connected to a positive voltage source through the first charging branch circuit, such that the first charging branch circuit positively charges the capacitor to be detected; and the capacitor to be detected is electrically connected to a negative voltage source through the second charging branch circuit, such that the second charging branch circuit negatively charges the capacitor to be detected.

3. The circuit according to claim 1, wherein the offsetting module comprises a first offset resistor and a second offset resistor, the offsetting module is connected to a negative voltage source through one terminal of the first offsetting branch circuit, the capacitor to be detected being in a first discharging state through the first offset resistor when the offsetting module offsets the base capacitance of the capacitor to be detected through the first offsetting branch circuit; and the offsetting module is connected to a positive voltage source through one terminal of the second offsetting branch circuit, the capacitor to be detected being in a second discharging state through the second offset resistor when the offsetting module offsets the base capacitance of the capacitor to be detected through the second offsetting branch circuit;

wherein a resistance of the first offset resistor is unequal to a resistance of the second offset resistor.

4. The circuit according to claim 1, wherein the charge transfer module comprises a differential amplifying circuit, an inverting terminal of the differential amplifying circuit is electrically connected to a common mode voltage, and a non-inverting terminal of the differential amplifying circuit is electrically connected to the capacitor to be detected, to transfer the charge on the capacitor to be detected; the non-inverting terminal of the differential amplifying circuit is electrically disconnected from the capacitor to be detected, to charge and offset the capacitor to be detected.

5. The circuit according to claim 1, before the driving module negatively charge the capacitor to be detected through a second charging branch circuit under the control of the control module, comprising, the charge transfer module transfer a charge on the capacitor to be detected to generate an output voltage.

6. The circuit according to claim 1, wherein the driving module comprises at least two switch units, and the at least two switch units switch switching states under the control of the control module to form the first charging branch circuit and the second charging branch circuit, respectively.

7. The circuit according to claim 6, wherein the switch units are single-pole single-throw switch units, and the control module is further configured to control one of the single-pole single-throw switch units to be closed, to form the first charging branch circuit, and control the other of the single-pole single-throw switch units to be closed, to form the second charging branch circuit; or the switch units are single-pole double-throw switch units, and the control module is further configured to control the single-pole double-throw switch units to switch between different contacts to form the first charging branch circuit and the second charging branch circuit.

8. The circuit according to claim 1, wherein the offsetting module comprises at least two switch units, and the at least two switch units switch switching states under the control of the control module to form the first offsetting branch circuit and the second offsetting branch circuit, respectively.

9. The circuit according to claim 8, wherein the switch units are single-pole single-throw switch units, and the control module is further configured to control one of the single-pole single-throw switch units to be closed, to form the first offsetting branch circuit, and control the other of the single-pole single-throw switch units to be closed, to form the second offsetting branch circuit; or the switch units are single-pole double-throw switch units, and the control module is further configured to control the single-pole double-throw switch units to switch between different contacts to form the first offsetting branch circuit and the second offsetting branch circuit.

10. A method for capacitance detection, comprising:
positively charging, by a driving module, a capacitor to be detected through a first charging branch circuit under the control of a control module;
offsetting, by an offsetting module, base capacitance of the capacitor to be detected through a first offsetting branch circuit under the control of the control module;
negatively charging, by a driving module, the capacitor to be detected through a second charging branch circuit under the control of a control module;
offsetting, by the offsetting module, the base capacitance of the capacitor to be detected through a second offsetting branch circuit under the control of the control module; and
transferring, by a charge transfer module, a charge on the capacitor to be detected to generate an output voltage.

11. The method according to claim 10, wherein when the first charging branch circuit positively charges the capacitor to be detected, the capacitor to be detected is connected to a positive voltage source through the first charging branch circuit; and when the second charging branch circuit negatively charges the capacitor to be detected, the capacitor to be detected is electrically connected to a negative voltage source through the second charging branch circuit.

12. The method according to claim 10, wherein the offsetting module comprises a first offset resistor and a second offset resistor, the offsetting module is connected to a negative voltage source through one terminal of the first offsetting branch circuit, and the capacitor to be detected being in a first discharging state through the first offset resistor when the offsetting module offsets the base capacitance of the capacitor to be detected through the first offsetting branch circuit; and the offsetting module is connected to a positive voltage source through one terminal of the second offsetting branch circuit, the capacitor to be detected being in a second discharging state through the second offset resistor when the offsetting module offsets the base capacitance of the capacitor to be detected through the second offsetting branch circuit;

wherein a resistance of the first offset resistor is unequal to a resistance of the second offset resistor.

13. The method according to claim 10, wherein the charge transfer module comprises a differential amplifying circuit, an inverting terminal of the differential amplifying circuit is electrically connected to a common mode voltage, a non-inverting terminal of the differential amplifying circuit is electrically connected to the capacitor to be detected when the charge on the capacitor to be detected is transferred, and the non-inverting terminal of the differential amplifying circuit is electrically disconnected from the capacitor to be detected when the capacitor to be detected is charged and offset.

14. The method according to claim 10, before negatively charging, by a driving module, the capacitor to be detected through a second charging branch circuit under the control of a control module, the method further comprised:
transferring, by a charge transfer module, a charge on the capacitor to be detected to generate an output voltage.

15. The method according to claim 10, wherein the driving module comprises at least two switch units, and the method further comprises: controlling, by the control module, the at least two switch units to switch switching states to form the first charging branch circuit and the second charging branch circuit, respectively.

16. The method according to claim 15, wherein the switch units are single-pole single-throw switch units, and the controlling, by the control module, the at least two switch units to switch switching states to form the first charging branch circuit and the second charging branch circuit comprises: controlling, by the control module, one of the single-pole single-throw switch units to be closed, to form the first charging branch circuit, and controlling, by the control module, the other of the single-pole single-throw switch units to be closed, to form the second charging branch circuit; or the switch units are single-pole double-throw switch units, and the method further comprises: controlling, by the control module, the single-pole double-throw switch units to switch between different contacts to form the first charging branch circuit and the second charging branch circuit.

17. The method according to claim 10, wherein the offsetting module comprises at least two switch units, and the method further comprises: controlling, by the control module, the at least two switch units to switch switching states to form the first offsetting branch circuit and the second offsetting branch circuit, respectively.

18. The method according to claim 17, wherein the switch units are single-pole single-throw switch units, and the controlling, by the control module, the at least two switch units to switch switching states to form the first offsetting branch circuit or the second offsetting branch circuit comprises: controlling, by the control module, one of the single-pole single-throw switch units to be closed, to form the first offsetting branch circuit, and controlling, by the control module, the other of the single-pole single-throw switch units to be closed, to form the second offsetting branch circuit; or the switch units are single-pole double-throw switch units, and the method further comprises: controlling, by the control module, the single-pole double-throw switch units to switch between different contacts to form the first offsetting branch circuit and the second offsetting branch circuit.

19. A touch chip, comprising a circuit for capacitance detection, the circuit comprised: a control module, a driving module, an offsetting module, and a charge transfer module, the driving module being configured to positively charge a to-be-detected capacitor through a first charging branch circuit; the offsetting module being configured to offset base capacitance of the capacitor to be detected through a first offsetting branch circuit under the control of the control module; the driving module being configured to negatively charge the capacitor to be detected through a second charging branch circuit under the control of the control module; the offsetting module being configured to offset the base capacitance of the capacitor to be detected through a second offsetting branch circuit under the control of the control module; the charge transfer module being configured to transfer a charge on the capacitor to be detected to generate an output voltage.

20. An electronic device, comprising a touch chip according to claim 19.

* * * * *